US006452979B1

(12) United States Patent
Ariel et al.

(10) Patent No.: US 6,452,979 B1
(45) Date of Patent: Sep. 17, 2002

(54) SOFT OUTPUT DECODER FOR CONVOLUTIONAL CODES

(75) Inventors: Meir Ariel; Ofer Amrani, both of Tel Aviv; Reuven Meidan, Ramat Hasharon, all of (IL)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/656,189

(22) Filed: Sep. 6, 2000

(51) Int. Cl.[7] ................................................ H03M 1/00
(52) U.S. Cl. ....................... 375/265; 375/341; 714/795
(58) Field of Search ................. 375/265, 341; 714/795

(56) References Cited

U.S. PATENT DOCUMENTS 5,933,462 A * 8/1999 Viterbi et al. ............... 375/341

FOREIGN PATENT DOCUMENTS

EP            1 115 209 A1       7/2001

OTHER PUBLICATIONS

Meir Ariel and Jakov Snyders, "Error–Trellises for Convolutional Codes—Part I: Construction", IEEE Transactions on Communications, vol. 46, No. 12, Dec. 1998, 10 pages.
Meir Ariel and Jakov Snyders, "Error–Trellises for Convolutional Codes—Part II: Decoding Methods", IEEE Transactions on Communications, vol. 47, No. 7, Jul. 1999, 10 pages.

L.R. Bahl, J. Cocke, F. Jelinek and J. Raviv, "Optimal Decoding of Linear Codes for Minimizing Symbol Error Rate", IEEE Transactions on Information Theory, Mar. 1974, 4 pages.

Jachim Hagenauer and Peter Hoeher, "A Viterbi Algorithm with Soft–Decision Outputs and its Applications", IEEE 1989, 7 pages.

Claude Berrou, Alain Glavieux and Puny Thitimajshima, "Near Shannon Limit Error—Correcting Coding and Decoding: Turbo–Codes (1)", IEEE 1993, 7 pages.

Patrick Robertson, Emmanuelle Villebrun and Peter Hoeher, "A Comparison of Optimal and Sub–Optimal MAP Decoding Algorithms Operating in the Log Domain", IEEE 1995, 5 pages.

* cited by examiner

*Primary Examiner*—Chi Pham
*Assistant Examiner*—Kevin M Burd
(74) *Attorney, Agent, or Firm*—Randall S. Vaas

(57) ABSTRACT

Soft output decoding of signals represented by a trellis of block length N divided into windows includes a step of decoding a forward recursion to a location that is I sections from the beginning of the window. An optimum state is detected at the end of the forward recursion. A backward recursion is performed from the determined state at the end of the window back to the beginning of the window to define a set of known backward recursion state metrics. Soft outputs are calculated during the backward recursion using the stored forward recursion state metrics, the backward recursion state metrics, and branch metrics at each state.

20 Claims, 6 Drawing Sheets

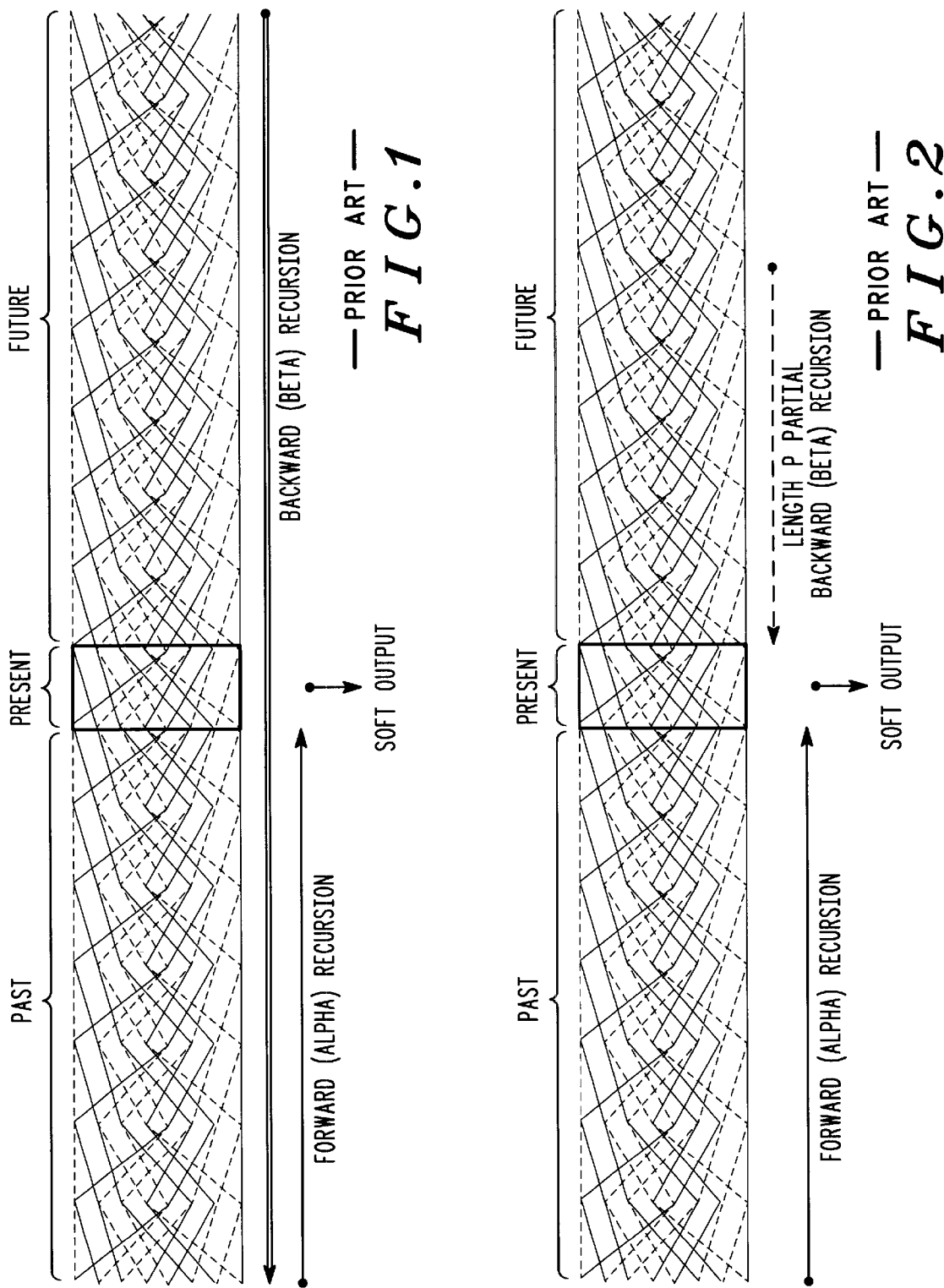

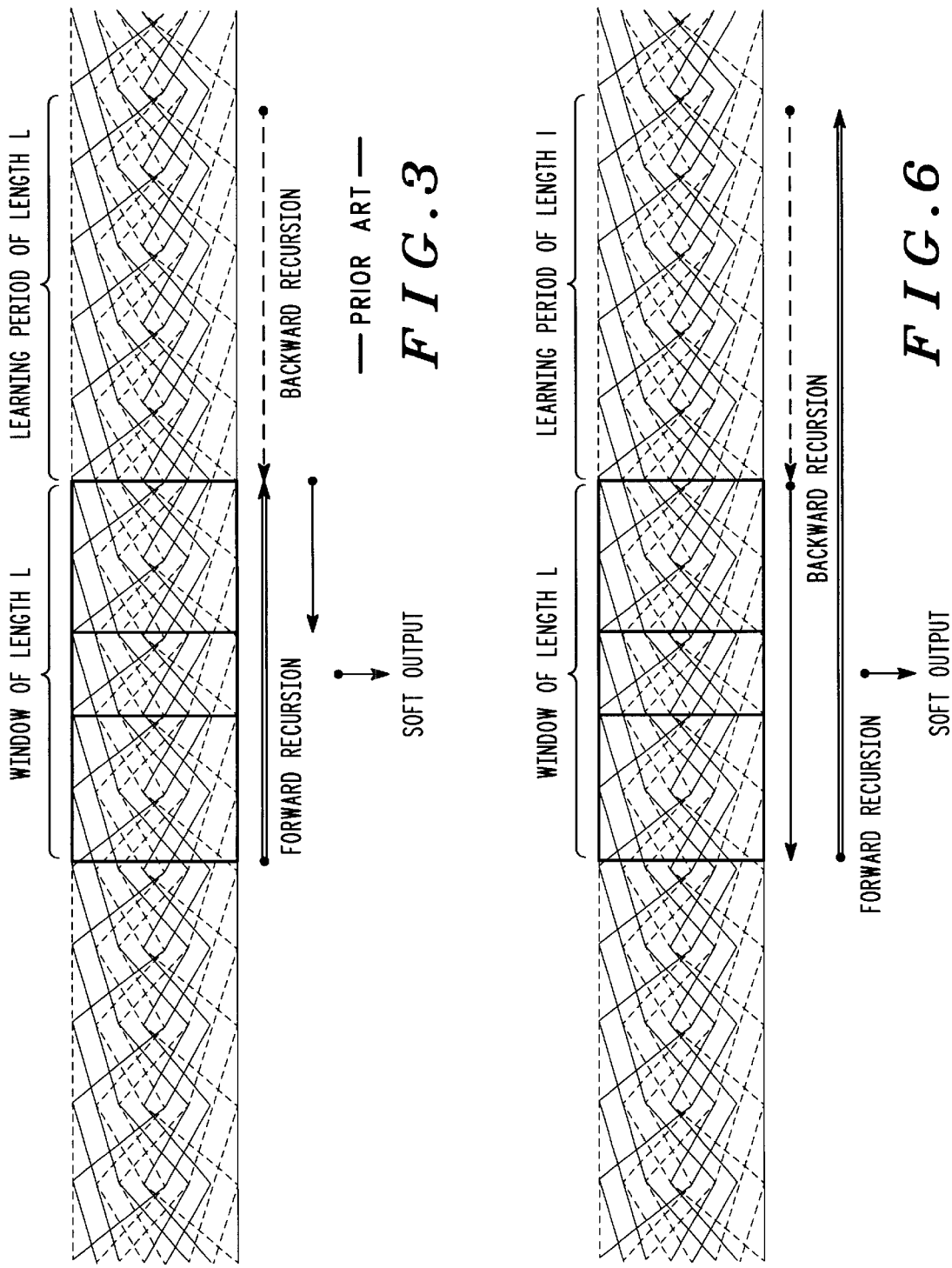

SOFT OUTPUT DECODER FOR CONVOLUTIONAL CODES

FIELD OF THE INVENTION

This invention relates generally to communication systems, and more particularly to soft output decoders for use in a receiver of a convolutional code communication system.

BACKGROUND OF THE INVENTION

Convolutional codes are often used in digital communication systems to protect transmitted information. At the transmitter, an outgoing code vector may be described using a trellis diagram whose complexity is determined by the constraint length of the encoder. Although computational complexity increases with increasing constraint length, the robustness of the coding also increases with constraint length.

At the receiver, a practical soft-decision decoder, such as a Viterbi decoder as is known in the art, uses a trellis structure to perform an optimum search for the maximum likelihood transmitted code vector. Coders for various communications systems, such as Direct Sequence Code Division Multiple Access (DS-CDMA) standard IS-95 and Global System for Mobile Communications (GSM) employ convolutional codes for error correction.

More recently, turbo codes have been developed that outperform conventional coding techniques. Turbo codes are generally composed of two or more convolutional codes and turbo interleavers. Turbo decoding is iterative using a soft output decoder to decode the constituent convolutional codes. The soft output decoder provides a reliability measure on each information bit, which helps the soft output decoder decode the other convolutional codes. The soft output decoder is usually a MAP (maximum a posterior) decoder, which uses both backward and forward decoding to determine the soft output. However, because of memory, processing, and numerical tradeoffs, MAP decoding is usually limited to a sub-optimal approximation. All of these variants require both forward and backward decoding over the block.

For future standards, such as the 3GPP (third generation partnership project for wireless systems), an 8-state turbo code with a block length of N=5120, will need 40960 words of intermediate storage, which may be unacceptable for practical implementation. Future systems employing larger frames and a greater number of states will require even more memory. By comparison, a Viterbi decoder that does not produce soft outputs for an N=5120, 8-state trellis requires less than 100 words of intermediate storage.

There is a need for a soft output decoder that reduces overall memory and processing requirements for decoding convolutional codes without the limitations imposed by prior art turbo and MAP decoders.

BRIEF DESCRIPTION OF THE DRAWINGS

FIG. 1 shows a trellis diagram for a first prior art soft output decoder technique;

FIG. 2 shows a trellis diagram for a second prior art soft output decoder technique;

FIG. 3 shows a trellis diagram for a third prior art soft output decoder technique;

FIG. 6 shows a trellis diagram for a soft output decoder technique;

DETAILED DESCRIPTION OF THE DRAWINGS

Figure 5:
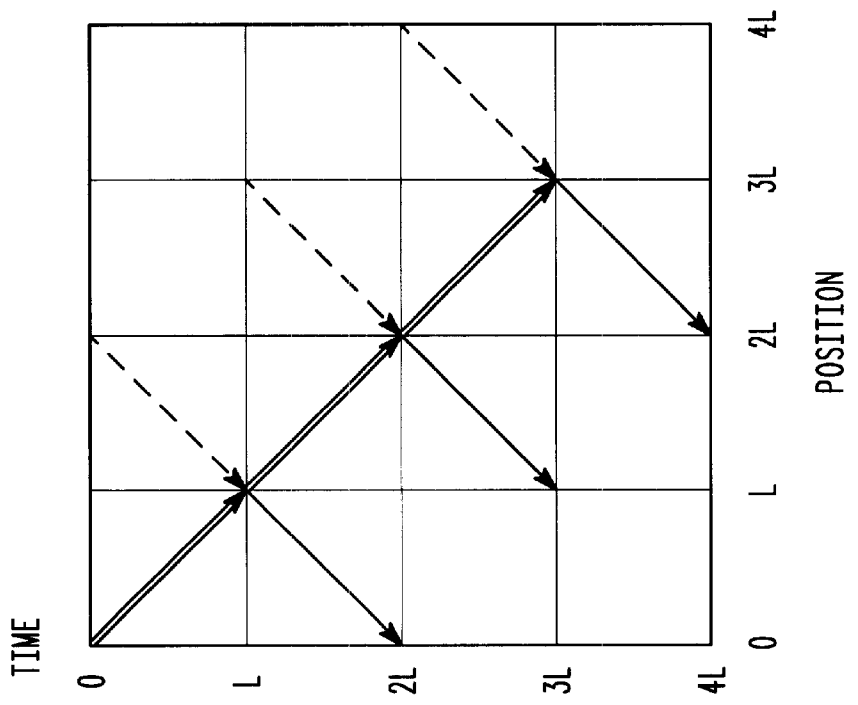
FIG. 5 shows an alternate expanded graphical representation of the diagram of FIG. 3.

A decoder performs efficient soft-output decoding of convolutional codes. The soft-output decoder includes two trellis decoders for decoding the sequence of signals received over the channel. The decoder uses forward and backward recursions through a window of length w trellis sections, wherein w is much less than N (N being the frame length or trellis length). During the forward recursion, forward state metrics ($\alpha$) are calculated and saved. In the backward recursion, backward state metrics ($\beta$) are calculated. A computationally efficient decoder initiates backward learning from a single state. The single state is identified from the forward recursion through the window (the forward state metrics) without the need to process the entire trellis length. The decoder's performance is effectively the same as that using full trellis learning without the memory requirements or complexity of a full trellis decoder.

Typically, convolutional codes such as turbo codes are graphically represented as a trellis, as shown in FIG. 1. Maximum a posteriori (MAP) type decoders (log-MAP, MAP, max-log-MAP, constant-log-MAP, etc.) utilize forward and backward generalized Viterbi recursions on the trellis in order to provide soft outputs, as is known in the art. The MAP decoder minimizes the decoded bit error probability for each information bit based on all received bits. Typical prior art MAP decoders require a large memory to support decoding.

Because of the Markov nature of the encoded sequence (wherein previous states cannot affect future states or future output branches), the MAP bit probability can be broken into the past (beginning of trellis to the present state), the present state (branch metric for the current value), and the future (end of trellis to current value). More specifically, the MAP decoder performs forward and backward recursions up to a present state wherein the past and future probabilities are used along with the present branch metric to generate an output decision. The principles of providing hard and soft output decisions are well known in the art, and several variations of the above described decoding methods exist.

Most of the soft input-soft output (SISO) decoders considered for turbo codes are based on the MAP algorithm in a paper by L. R. Bahl, J. Cocke, F. Jelinek, and J. Raviv entitled "Optimal Decoding of Linear Codes for Minimizing Symbol Error Rate", IEEE Transactions on Information Theory, Vol. IT-20, March 1974, pp. 284–7 (the "BCJR algorithm" or "BCJR method").

FIG. 1 shows a trellis diagram for this algorithm for an 8-state convolutional code, which can be used in a turbo code. As will be recognized by those skilled in the art, turbo coders are constructed with interleavers and constituent codes, which are usually systematic convolutional codes, but can alternately be block codes. MAP algorithms not only minimize the probability of error for an information bit given the received sequence, they also provide the probability that the information bit is either a 1 or 0 given the received sequence. The BCJR algorithm provides a soft output decision for each bit position (trellis section) wherein the influences of the soft inputs within the block are broken into contributions from the past (earlier soft inputs), the present soft input, and the future (later soft inputs). This decoder algorithm requires a forward and a backward generalized Viterbi recursion on the trellis to arrive at an optimal soft output for each trellis section, or stage. These a posteriori probabilities, or more commonly the log-likelihood ratio (LLR) of the probabilities, are passed between SISO decoding steps in iterative turbo decoding. The LLR for information bit $u_t$ is $$\Lambda_t = \log \frac{\sum_{(m,n) \in B^1} \alpha_{t-1}(n)\gamma_t(n,m)\beta_t(m)}{\sum_{(m,n) \in B^1} \alpha_{t-1}(n)\gamma_t(n,m)\beta_t(m)}, \quad (1)$$

for all bits in the decoded sequence (t=1 to N). In equation (1), the probability that the decoded bit is equal to 1 (or 0) in the trellis given the received sequence is composed of a product of terms due to the Markov property of the code. The Markov property states that the past and the future are independent given the present. The present, $\gamma_t(n,m)$, is the probability of being in state m at time t and generating the symbol $\gamma_t$ when the previous state at time t−1 was n. The present operates as a branch metric. The past, $\alpha_t(m)$, is the probability of being in state m at time t with the received sequence $\{\gamma_t, \ldots \gamma_t\}$, and the future, $\beta_t(m)$, is probability of generating the received sequence $\{\gamma_{t+1}, \ldots \gamma_n\}$ from state m at time t. The probability $\alpha_t(m)$ can be expressed as function of $\alpha_{t-1}(m)$ and $\gamma_t(n,m)$ and is called the forward recursion $$\alpha_t(m) = \sum_{n=0}^{M-1} \alpha_{t-1}(n)\gamma_t(n,m), \quad m = 0, \ldots, M-1, \quad (2)$$

where M is the number of states. The reverse or backward recursion for computing the probability $\beta_t(n)$ from $\beta_{t-1}(n)$ and $\gamma_t(n,m)$ is $$\beta_t(n) = \sum_{m=0}^{M-1} \beta_{t+1}(m)\gamma_t(n,m), \quad n = 0, \ldots, M-1. \quad (3)$$

The overall a posteriori probabilities in equation (1) are computed by summing over the branches in the trellis $B^1$ ($B^0$) that correspond to $U_t=1$ (or 0).

The LLR in equation (1) requires both the forward and backward recursions to be available at time t. The BCJR method for meeting this requirement is to compute and store the entire backward recursion, and recursively compute $\alpha_t(m)$ and $\Lambda_t$ from t=1 to t=N using $\alpha_{t-1}$ and $\beta_t$. The disadvantage of this decoder is that the probabilities for the entire block of N stages must first be stored in memory before processing. Not only does this require a large memory (memory size =N*M*bits, where N is the number of sections in the trellis, M is the number of states and bits is the number of bits per state), this also causes a signal delay of length N before any information can possibly be output. In a W-CDMA system (N~5000, M=8, 13 bits) the memory required is about 0.5 Mbits. In a cdma2000 system, N is approximately 20000, requiring a memory of about 2 Mbits. For small sequence lengths, memory utilization is generally not an issue. However, for the large N where turbo codes perform the best, memory utilization is significant.

In terms of complexity, the BCJR method requires N*M state updates for the backward recursion (M state updates per trellis section, N trellis sections in the code) and [1] provides optimal performance. In practice, a backward recursion is first performed by a processor across the entire block (as shown in FIG. 1) and stored in memory. A forward recursion is then performed by the processor. The results of the backward and forward recursions are used with the present state and stored future state to arrive at a soft output decision for each stage. In this case the processor operates on each state twice, once to generate and store the backward recursion states, and once to generate the forward recursion state.

To address the memory utilization problem of the full trellis decoder using the BCJR algorithm, a sliding window method was developed. The sliding window technique is described in a paper by S. Benedetto, D. Divsalar, G. Montorsi, and F. Pollara, entitled "Algorithm for continuous decoding of turbo codes," Electronics Letters, Vol. 32, Feb. 15, 1996, pp. 314–5, and is represented in FIG. 2 (in the figures that follow a solid arrow represents an output provided with recursion but no storage, a dotted arrow represents a learning period with no output and no storage, and a hollow arrow represents a stored recursion with no output, with the direction of the arrows indicating forward or backward recursions). An assumption that all states at time t+P are equally probable (or unknown) is used for the backward recursion. To use this assumption, the learning period P must be several constraint lengths of the constituent code in order to provide near-optimal performance. Making the learning period too small can introduce noticeable performance degradation, similar to the effects of "finite" traceback in the conventional Viterbi algorithm.

The sliding window technique does not require a significant amount memory, but is computationally complex. Specifically, instead of an entire backward recursion being performed and stored, only a partial backward recursion is performed (and not stored) to determine each state. For each present state, the algorithm initializes the future recursion at a learning period that is P away from the present state and at an initial state that is unknown. Future probabilities are calculated backwardly from the unknown future point, not from the known end of the trellis. The length P (learning period) is set such that by the time the partial backward recursion reaches the present state, the future probabilities are most likely correct. P depends on the rate and constraint length of the code and the expected channel conditions. For example, given an 8-state decoder with a ½ rate convolutional code, P is typically between 16 and 32, and P is some multiple of the constraint length. The disadvantage of this decoder is that the partial backward recursion is started with equally likely (unknown states) and is allowed to iterate until it reaches the present window. This is a sub-optimal algorithm as the sliding window causes degradation from true MAP performance, similar to the effects of finite traceback in a conventional Viterbi algorithm, increasing the probability of decoded bit error. Also, the processor operates on each state P times (throughput of 1/P) and has an output delay of P. Moreover, this algorithm requires P times the complexity, which can only be reduced by adding more processing.

The sliding window method can be summarized as follows, for t=1 to N, compute the backward recursion starting at time t+P to time t, and compute $\alpha_t(m)$ and $\Lambda_t$ from $\alpha_{t-1}(m)$ and $\beta_t$. The sliding window method reduces the memory requirement from N*M, which is needed in the BCJR method, to a relatively insignificant amount for the recursion. Assuming double buffering, the amount of memory is only 2M, and can be safely ignored in the analysis.

However, to achieve this memory saving, the computational complexity for the backward recursion increases by a factor of P. The sliding window method is also sub-optimal due to the "finite" window size.

Another prior art decoder, described in U.S. Pat. No. 5,933,462 to Viterbi et al. (and similarly in a paper of S. Pietrobon and S. Barbulescu, "A Simplification of the Modified Bahl et al. Decoding Algorithm for Systematic Convolutional Codes," Int. Symp. On Inform. Theory and its Applications, Sydney, Australia, pp. 1073–7, November 1994, revised Jan. 4, 1996 and S. Pietrobon, "Efficient Implementation of Continuous MAP Decoders and a Synchronisation Technique for Turbo Decoders," Int. Symp. On Inform. Theory and its Applications, Victoria, B.C., Canada, pp. 586–9, September 1996) comprises another sliding window technique, as represented in FIG. 3.

The Viterbi sliding window method of FIG. 3 reduces the large increase in computational complexity of the prior art sliding window method by performing processing in small blocks. The backward recursion is started at time t+2L, and the backward recursion values are stored from time t+L to time t. The forward recursion and output likelihood computation are then performed over the block of time t to time t+L. Memory is reduced from NM (the number of sections in the block times the number of states) down to LM (the number of sections in the window times the number of states), while only doubling the computational complexity. The key observation of starting the recursion in an unknown state is the same as for the sliding window technique, the backward recursion is sub-optimal as each of the possible states of the backward recursion starting stage for each trellis window must be considered. This technique requires some memory and is still computationally complex.

In summary, a decoder using the Viterbi sliding window differs from the previously described sliding window technique by providing a window that slides forward in blocks rather than a symbol at a time. Specifically, a sliding window is defined having a length L that is equal to the previously described learning period P. Also, L is some fraction of the total trellis length, N, and the window slides from the beginning to the end of the trellis in steps of length L. In this way, the memory required in prior art decoders, where the entire trellis was stored, has been reduced from N to NIL (typically 3 kbits for cdma2000 and W-CDMA systems where L=32). However, it is sub-optimal as previously described.

The timing issues will now be described with respect to FIG. 4 that shows an expanded diagram of the graph of FIG. 3 with a time component added. In operation, at time 0 a forward processor performs a forward recursion over a first window from stage 0 to L and stores the information while over the same time period a backward processor performs a backward recursion from stage 2L to L to define a known state at the end of the first window at stage L at time L. Thereafter, a second backward recursion operates from time L to 2L over stage L to 0 to define the soft outputs over the first window. At this time, the soft decisions can be reversed and output in order (which clearly occurs after a delay of 2L), the memory is cleared, the window stage slides forward a length of L, and the process repeats. Alternatively, with an additional backward recursion processor and memory, throughput can be increased.

FIG. 5 shows an alternative result for the graph of FIG. 3 using an additional backward processor. In operation, at time 0 the forward processor performs a forward recursion over a first window from stage 0 to L and stores the information while over the same time period the backward processor performs a backward recursion from stage 2L to L to define a known state at the end of the first window at stage L at time L. Thereafter, a second backward recursion operates from time L to 2L over stage L to 0 to define the soft outputs over the first window. At the same time, the forward and additional backward processor start a second cycle by beginning to process information the second window (from stage L to 2L). At time 2L, the soft decisions for the first window are output while the forward recursion and backward learning period for the second window have already been completed. Then a second backward recursion for the second window is performed to obtain the soft outputs for the second window. As can be seen, this technique doubles the throughput. Twice the memory is needed as the information of the forward recursion for the first window is being used while the forward recursion for the second window is being stored.

The above decoders (specifically of FIGS. 4 and 5) suffer from the problem that they are sub-optimal. These decoders must start at trellis stage 0 and/or trellis stage N in order to initiate recursion from an optimum state. Starting at stage N requires backward recursion of coefficients over the entire length of the trellis, introducing substantial timing and memory capacity issues. Starting at any other location in the trellis requires consideration of all possible states as the starting state, introducing potential degradation of performance.

Figure 7:
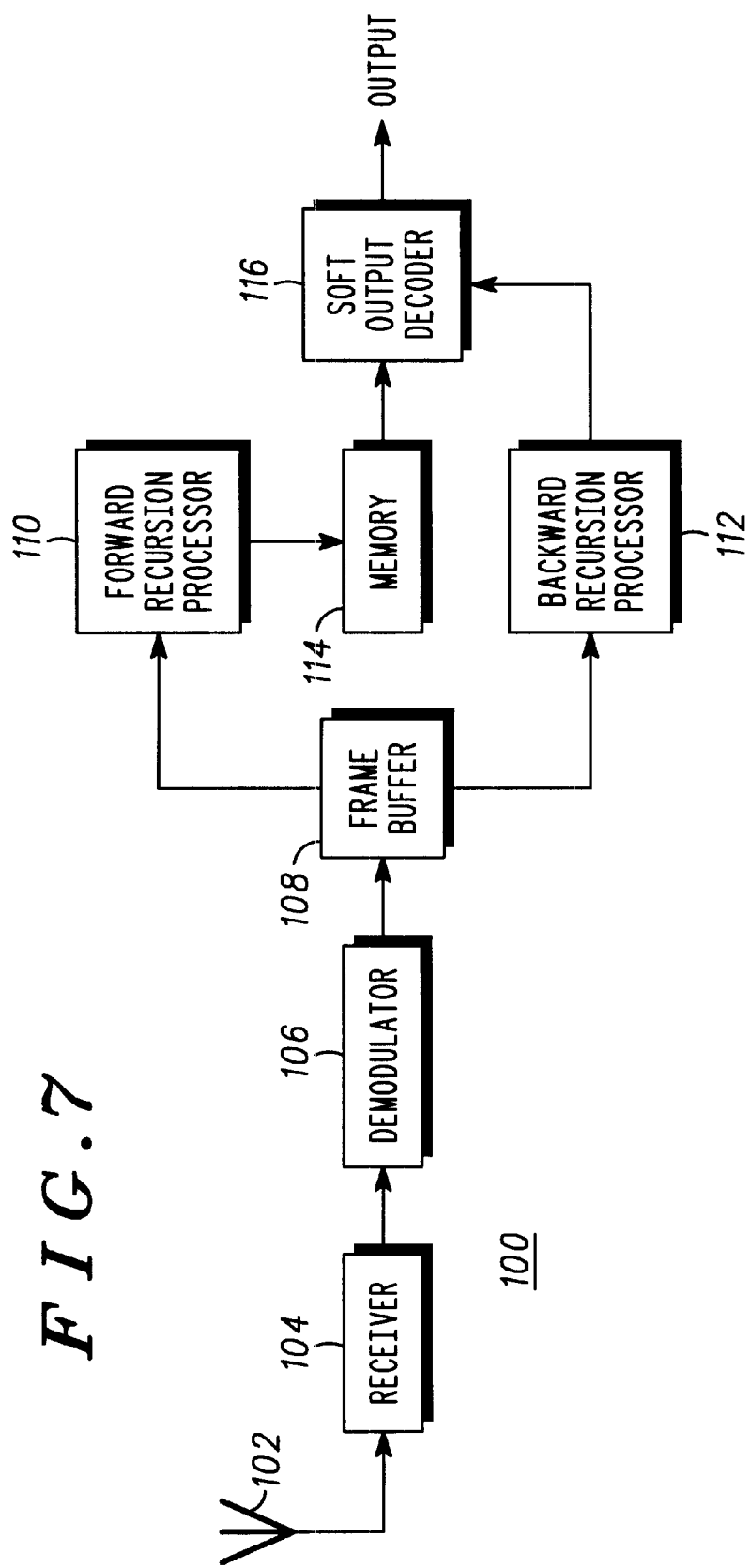
FIG. 7 shows a block diagram of a soft output decoder according to the trellis diagram according to FIG. 6.

The present invention solves these problems in a novel way. FIG. 6 shows a trellis diagram utilizing an improved decoding method. The trellis code is obtained from a coded sequence of signals represented by a trellis of length N in a communication system, as simplified in FIG. 7. In a radiotelephone 100, a signal travels through an antenna 102 to a receiver 104 and demodulator 106, as is known in the art. The demodulator may be a digital demodulator following an analog-to-digital (A/D) converter, for example. The demodulated signal is loaded into a frame buffer 106. A forward recursion processor 110 and backward recursion processor 112 operate on the block.

Figure 4:
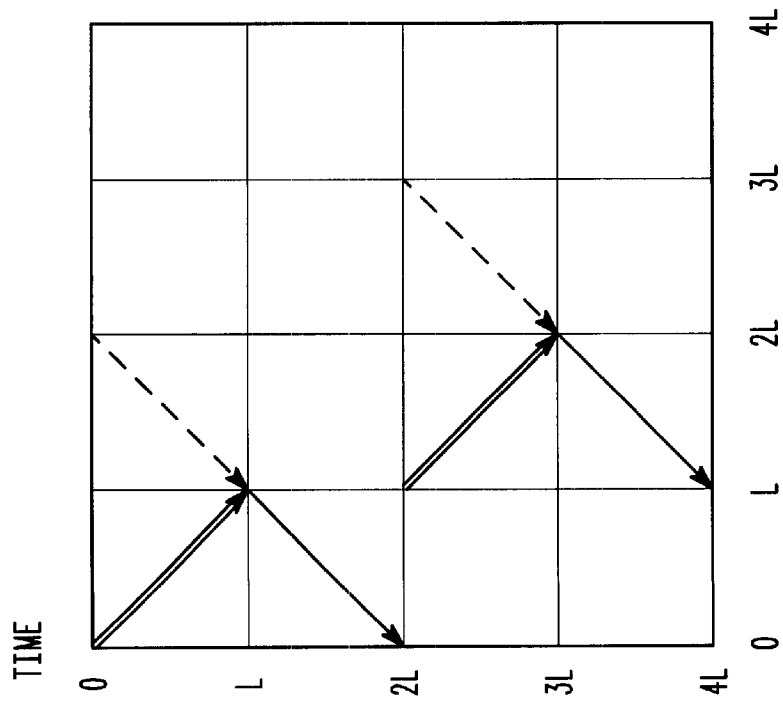
FIG. 4 shows an expanded graphical representation of the diagram of FIG. 3.

The present invention differs from the previously described sliding window technique of FIGS. 3–5 in that it is an optimal technique wherein both forward and backward recursions in each window begin from a known state. The present invention performs a forward recursion from the front of the window over a length L+I. In general, forward recursion coefficients Care generated and saved over length L+I beginning from the known state at the beginning of the window. At the end of the forward recursion, the state at location L+I having the highest a $(S_{max})$ is identified. $S_{max}$ is optimum in the sense that it lies with high probability along the optimal path through the trellis. Backward recursion occurs during a training period beginning from the optimum state $S_{max}$ at stage L+I and moving to stage L. The soft values can be generated from the backward recursion decoder as the decoder moves from section L to the starting point. After reaching location 0 (time $t_0$), the decoder slides L+I sections to the right as the new starting point for forward recursions, and forward recursions are performed to generate a new optimum state at a location 2L+I sections from the starting point to. This process of sliding, forward recursions, and backward recursions is repeated until the entire trellis block is decoded.

The sliding window of decoded sections has a length L. L may be of any length, such that an integer multiple of L equals the total trellis length N. Alternatively, a non-integer multiple of L may equal the trellis length N. In either case, the window slides from the beginning to the end of the trellis in steps of length L. Although it will be recognized that it is not necessary that windows be of an equal length of sections, it is assumed that they are equal for purposes of explanation.

More particularly, forward recursion processor 110 performs a forward recursion (using a generalized Viterbi algorithm) moving from the known beginning state of the window to an initial end point at least I trellis stages beyond the end of a window of length L to be decoded. The value I is greater than the controllability index (i.e., the number of branches through the trellis required to connect a given state to any other state). For example, where there are 8 states, I will preferably be greater than 3 (where the decoder can move up to two states in each stage step). The forward recursion metrics are optimum values because the forward recursion metrics are derived during a recursion process beginning from the known end state of the previous window.

The backward recursion is performed by the backward recursion processor 112, starting with a learning period initiated at the optimum state found at the end of the forward recursion process. During the backward recursion, the backward recursion coefficients $\beta_t(m)$ are computed and combined with the forward recursion coefficients $\alpha_t(m)$ stored in memory 114 and branch metrics from which decoder 116 outputs the soft output decisions as they are generated.

At the end of the first decoded window, the forward recursion processor slides forward an L+I stages and the process is repeated for the second window and each subsequent window until the entire block is decoded. In a preferred embodiment, processors 110 and 112 operate within adjacent windows simultaneously. In particular, when the backward recursion processor 110 operates within an earlier window the forward recursion processor 112 decodes a portion of the trellis for the subsequent adjacent window starting from the last stage that forward recursion state metrics were generated for the previous window. A set of forward recursion state metrics are preferably defined for the subsequent window and stored in memory 114. This leaves the backward recursion processor 112 available to begin decoding the next window immediately after the present window is processed.

It should be recognized that separate buffer memories could be used for each window, or a circular buffer could be used wherein each forward recursion state metrics for a subsequent window replace backward recursion state metrics for the present window as the soft outputs are generated. Preferably, the forward and backward processors operate concurrently until all of the windows within the block are decoded.

The advantage of the present invention is that the backward recursion for the soft output decoder starts from a single state which lies with high probability along the optimal path through the trellis, in contrast to the prior art. The performance of the decoder was simulated and compared to turbo decoding that decodes and stores the full trellis block backward recursion decoding. The performance was found to be substantially the same for both MAX-log-MAP turbo decoding and Log-MAP decoding.

Figure 8B:
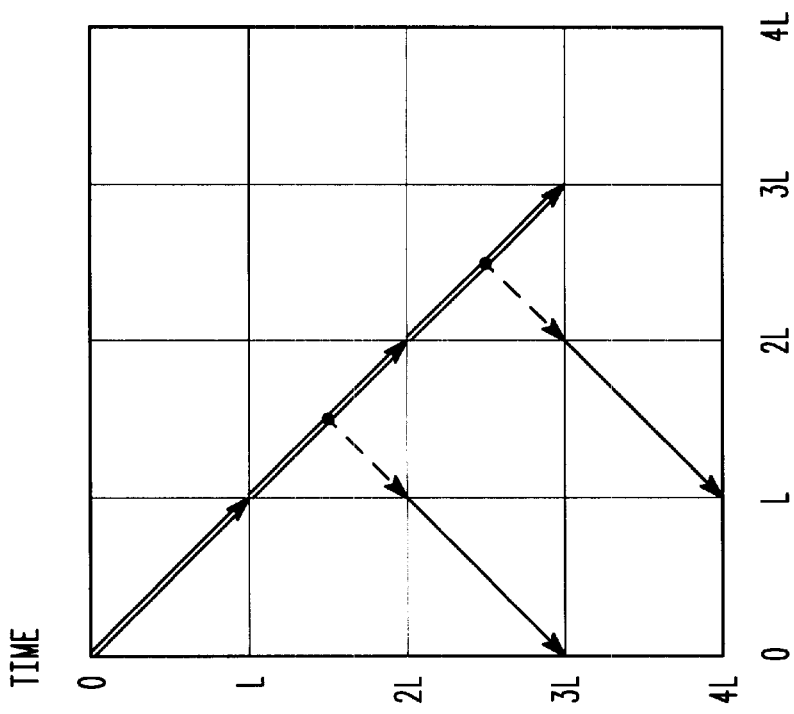
FIGS. 8A and 8B show an expanded graphical representation of the trellis diagram of FIG. 6.
Figure 8A:
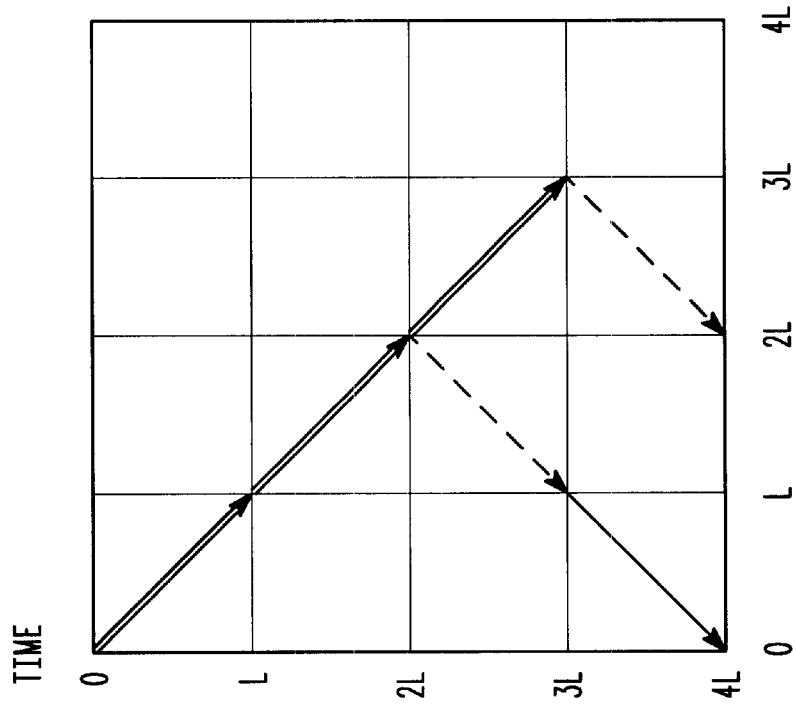

FIGS. 8*a* and 8*b* show expanded diagrams of the graph of FIG. 6 with a time component added. In operation, at time 0 the forward recursion processor 110 performs a first forward recursion from stage 0 to L+I. FIG. 8*a* illustrates the case where I=L. FIG. 8*b* illustrates the case where I=1/2L. As indicated above, I can have any value so long as I is greater than the number of sections required to move between any two states. Additionally, the larger I is, the better the results will be. In one simulation, L =30 and I =34. The backward recursion is performed first over I sections starting with state $S_{max}$ to identify the starting state at the end of window L, and then through the window L. Consequently, a delay of 2(L+I) will occur before the soft outputs will be generated for window L. Although this delay is longer than some sliding window methods, it is much less than a full trellis turbo decoder. The present invention computes each soft output in accordance with known turbo coding techniques, such as those represented in the Bahl et al. paper (BCJR algorithm) cited above.

The advantage of the present invention is that it provides comparable output to the full block turbo decoder, but using significantly less memory and introducing much less delay.

Figure 9:
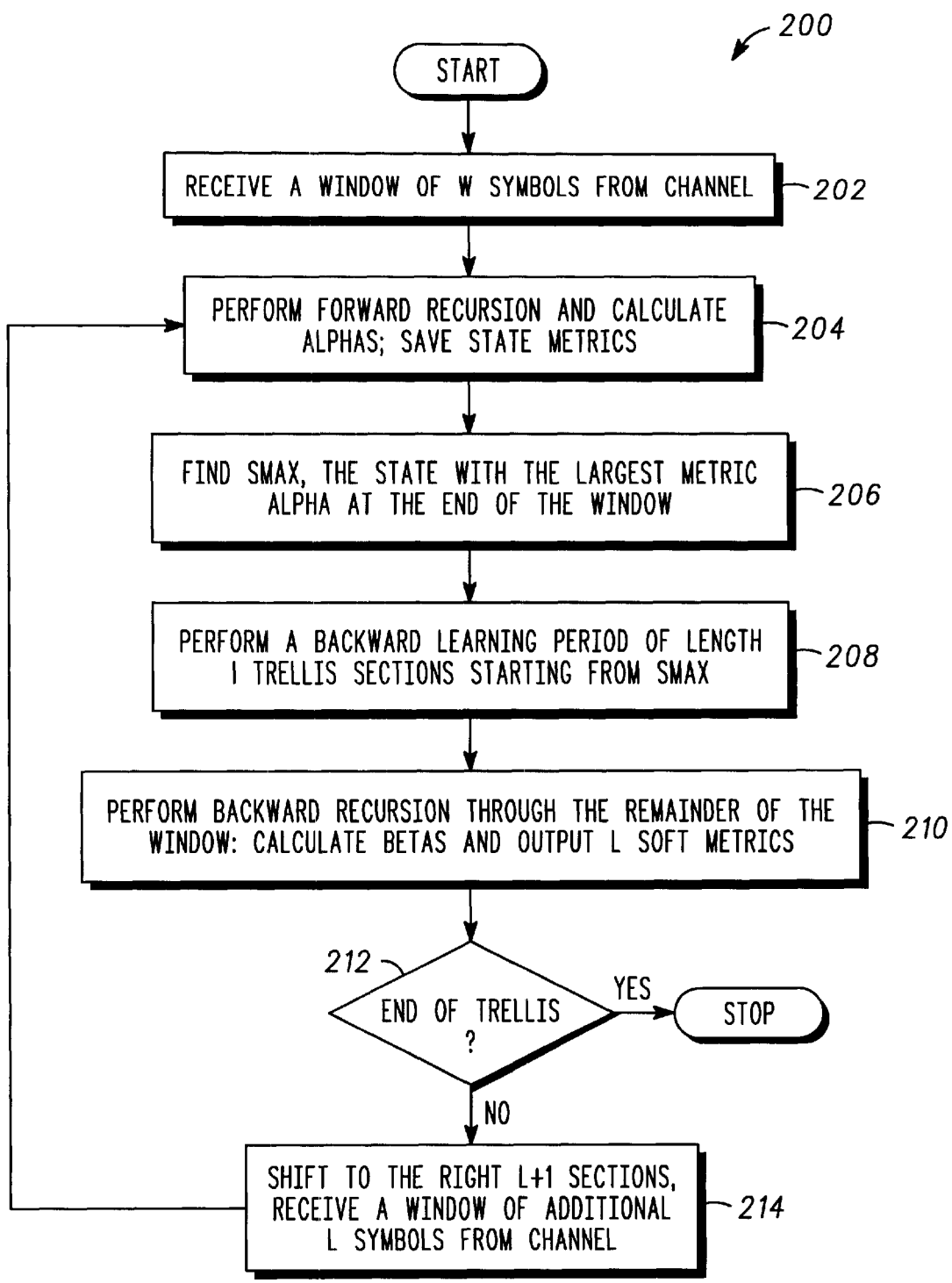
FIG. 9 shows a flow chart of a soft output decoder method for a decoder according to FIGS. 6–8.

FIG. 9 shows a flow chart representing a method 200 of decoding a received convolutionally coded sequence of signals represented by a trellis of block length N, in accordance with the present invention (also see FIG. 6). A first step 202 is receiving w soft-input symbols (a prior Log Likelihood Ratios), where L+I≦w<N, is received. N is the length of the trellis, and it is preferably much longer than w. The forward recursion decoder 110 decodes forwardly over length L+I such that coefficients a are calculated and saved in memory for all states within the sections L+I. At the conclusion of the forward recursion, which uses a generalized Viterbi algorithm for example, the state in the last section having the largest $\alpha$, denoted by $S_{max}$, is identified, as indicated in step 204. This state is selected to be the starting point for backward recursion. From state $S_{max}$, the backward recursion decoder performs backward recursion over a learning period of length 1. During the backward recursion (step 208), a generalized Viterbi algorithm may for example be used. The training period over length I can be any length, although the longer the length I, the more reliable the state will be at the end of backward recursion trellis point L. The training period I must be sufficiently long to insure that the trellis has an opportunity to open to its full spread (all possible states) by the end of the learning period. Those skilled in the art will recognize that the learning period I will preferably be much larger than the minimum length necessary for the trellis to open fully.

The next step 210 is decoding the window using backward recursion from stage L at the end of the window to the beginning of the window. The length L can be variable or it can of any predetermined fixed length. The window length L can be selected such that the length is independent of the constraint length of the convolutional code. Alternatively it can be set to a multiple of the constraint length of the convolutional code for convenience. During step 210, alphas calculated in step 204, betas calculated in step 210, and branch metrics are used to generate soft metrics, which may be stored in buffers so that they can be output in forward order. Alternatively, alphas and betas can both be stored and the soft outputs for the window can be generated in forward order from the stored alphas and betas. This alternative has the disadvantage that it would introduce additional delay and require more memory.

The soft outputs are calculated at each stage of the forward recursion process using the forward recursion state metrics, the branch metrics, and the stored backward recursion state metrics, and outputting the soft output for that stage (trellis section). Preferably, the recursion updates and soft outputs are calculated using a MAP type algorithm, such as the MAP algorithm or one of the MAP derivatives which include log-MAP, max-log-MAP, constant-log-MAP, and the like.

Once a window is completely decoded, the decoder can be "slid" forward a distance L+I sections (step 214) such that forward recursion begins at the end of the previous forward recursion. In this manner the forward recursion starts at a previously determined known state and forward recursion state metrics for particular sections are not repeatedly generated. The above steps 204 through 210 are repeated for the subsequent window. This process continues until all of the windows in the trellis block N are processed. The end of the trellis is detected in decision step 212. At the end of the trellis, stage N, has a known state. Accordingly, once stage N is reached in the forward direction, that state is selected as the beginning state for backward recursion and training is not required prior to backward recursion for the last window of the frame (block N).

It is envisioned that a forward recursion for a subsequent window can occur at the same time that a backward recursion is occurring in an earlier window. In other words, the processing for the second window begins while the first window is being processed. In particular, the further step includes repeating the above steps, wherein inputting a next window starting at the end of the presently selected window, and wherein the decoding and calculating steps for the next window occur one step out of sequence and concurrently with the processing of the present window. This additional step saves processing time, although some additional memory is required.

Alternatively, a single processor can be used for forward and backward. If a single processor is used, forward recursion will first occur through windows L and 2L, followed by backward recursion through window 2L (training) and window L, followed by forward recursion through window 3L, followed by backward recursion through window 3L (training) and window 2L, followed by forward recursion through window 4L, followed by backward recursion through window 4L (training) and window 3L, and continuing in this manner to the end of the block such that the entire block of length N is decoded.

The present invention provides performance substantially the same as a decoder using backward recursion through the entire block of N stages prior to outputting soft metrics, but operates with increased throughput and substantially less memory for backward recursion. While specific components and functions of the soft output decoder for convolutional codes are described above, fewer or additional functions could be employed by one skilled in the art within the broad scope of the present invention, and the invention should be limited only by the appended claims.

What is claimed is:

1. A method of decoding a received convolutionally coded sequence of signals represented by a trellis of a total block length N, where N is an integer, comprising the steps of:
    decoding a portion of the trellis using forward recursion, the portion being shorter than the block length N and including a window of length L, L being an integer, and a learning interval, the forward recursion to define a set of forward recursion state metrics for the portion decoded;
    decoding the portion of the trellis using backward recursion, the backward recursion using only a single optimal state $S_{max}$ at end of the portion for the backward recursion, where $S_{max}$ lies with high probability along the optimal-path, state $S_{max}$ determined from the forward recursion, the backward recursion starting from the single state and moving to the beginning of the window to define a set of backward recursion state metrics within the window; and
    calculating soft outputs for the window sections using the forward recursion state metrics, the backward recursion state metrics, and branch metrics, and outputting the soft output at each section of the trellis within the window.

2. The method of claim 1, wherein the step of decoding at least a portion of the window of the trellis using forward recursion calculates forward recursion coefficients beginning from a known state at the beginning of the window.

3. The method of claim 1, wherein the step of decoding the portion of the trellis using backward recursion calculates coefficients over a learning period of I stages, where I is an integer greater than a controllability index of the trellis.

4. The method of claim 1, wherein the step of decoding the window of the trellis using forward recursion calculates coefficients over L+I sections of the trellis, where L is an integer fraction of the total trellis length and I is an integer.

5. The method of claim 1, wherein the length L is a multiple of a constraint length of the convolutional code.

6. The method of claim 1, wherein the length L is independent of a constraint length of the convolutional code.

7. The method of claim 1, wherein the decoding steps include decoding using a generalized Viterbi algorithm.

8. The method of claim 1, wherein the calculating step uses a maximum a posteriori (MAP) algorithm to calculate the soft output at each stage.

9. The method of claim 8, wherein the MAP algorithm includes a log-MAP algorithm.

10. The method of claim 1, further comprising the step of sliding forward by at least the window length L and repeating the decoding and calculating steps until the entire block length N is decoded.

11. The method of claim 10, wherein each step of sliding includes sliding forward L+I trellis sections, followed by steps of performing forward recursions over L sections, determining $S_{max}$, and performing backward recursions over L+I trellis sections.

12. The method of claim 11 wherein the step of decoding by a forward recursion a subsequent window occurs simultaneously with decoding in a backward recursion an earlier window.

13. A method of decoding a received convolutionally coded sequence of signals represented by a trellis of a total block length N, where N is an integer, comprising the steps of:
    decoding a portion of the trellis using forward recursion, the portion being shorter than the block length N and including a window and a learning interval, the forward recursion to define a set of forward recursion state metrics for the portion decoded;
    decoding the portion of the trellis using backward recursion starting from a single state determined from the forward recursion, the backward recursion starting from the single state and moving to the beginning of the window to define a set of backward recursion state metrics within the window, wherein a respective alpha is calculated for each possible state at the end stage of the forward recursion through the portion, each alpha being the respective metric for a respective state accumulated starting at the initial state of the portion of the trellis and ending at the respective state at the end of forward recursion, the single determined state from which backward recursion is initiated is the state $S_{max}$ wherein $S_{max}$ is the state at the end stage of the window which at the end of forward recursion has the highest alpha; and
    calculating soft outputs for the window sections using the forward recursion state metrics, the backward recursion state metrics, and branch metrics, and outputting the soft output at each section of the trellis within the window.

14. A decoder for decoding a received convolutionally coded sequence of signals represented by a trellis of block length N, N being an integer, comprising:

memory;

forward recursion processing to generate forward recursion state metrics for a window and I sections beyond the end of the window, the forward recursion processing coupled to the memory to store forward recursion state metrics, the window being shorter than the block length where I is a non-zero integer;

backward recursion processing to decode from the section more than 1 sections beyond the end of the window, the backward recursion processing starting from a highest probability state at the section I sections beyond the end of the window, the highest probability state calculated in the forward recursion processing, the backward recursion processing to define backward recursion state metrics through the window; and a calculator outputting soft outputs from the stored forward recursion state metrics, backward recursion state metrics, and branch metrics.

15. A radiotelephone with a receiver and demodulator for processing by a soft-decision output decoder a convolutionally coded sequence of signals represented by a trellis of block length N divided into windows of length L in a frame buffer, N and L each being integers, the decoder comprising:

a memory;

forward recursion processing to decode a portion of the trellis block length using a forward recursion from a beginning of the window to a section beyond the end of the window, the forward recursion processing to identify an optimum state at the end of the forward recursion, the optimum state being a state determined to have a high probability of lying along the optimal path through the trellis, and the forward recursion processing producing forward recursion state metrics stored in the memory;

backward recursion processing to decode the portion of the trellis within the window using backward recursion starting from the optimum state, the backward recursion processing producing backward recursion state metrics, and backward recursion using the optimum state such that fewer than all of the states at the last stage of the portion are used as a starting port for backward recursion; and a decoder coupled to the memory and the backward recursion processing to calculate soft outputs at each stage of the backward recursion within the window using the stored forward recursion state metrics, the backward recursion state metrics, and branch metrics at each stage, and to output the soft output for that sage.

16. The radiotelephone of claim 15, wherein the forward and backward processors use a generalized Viterbi algorithm.

17. The radiotelephone of claim 15, wherein the decoder uses a maximum a posteriori (MAP) algorithm to calculate the soft output at each stage.

18. The radiotelephone of claim 17, wherein the MAP algorithm includes one of a log-MAP, MAP, max-log-MAP, and constant-log-MAP algorithm.

19. The radiotelephone of claim 15, wherein while the backward recursion processing decodes earlier trellis sections, the forward recursion processing decodes later trellis sections to define a set of known forward recursion state metrics which are stored in the memory as the memory is cleared during the backward recursion processing.

20. The radiotelephone of claim 19, wherein the forward and backward processing operate concurrently until all of the windows within the block length N are decoded.

* * * * *

UNITED STATES PATENT AND TRADEMARK OFFICE
CERTIFICATE OF CORRECTION

PATENT NO.     : 6,452,979 B1
DATED          : September 17, 2002
INVENTOR(S)    : Ariel et al.

It is certified that error appears in the above-identified patent and that said Letters Patent is hereby corrected as shown below:

Column 12,
Line 9, change "port" to -- point --
Line 16, change "sage" to -- stage --

Signed and Sealed this

Twenty-eighth Day of January, 2003

JAMES E. ROGAN
*Director of the United States Patent and Trademark Office*